(12) United States Patent
Lin et al.

(10) Patent No.: US 12,620,446 B2
(45) Date of Patent: May 5, 2026

(54) MEMORY SEARCHING ENGINE, REFERENCE ARRAY AND REFERENCE CALIBRATING METHOD

(71) Applicant: MACRONIX INTERNATIONAL CO., LTD., Hsinchu (TW)

(72) Inventors: Yu-Hsuan Lin, Taichung City (TW); Po-Hao Tseng, Taichung City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 199 days.

(21) Appl. No.: 18/582,708

(22) Filed: Feb. 21, 2024

(65) Prior Publication Data

US 2025/0266104 A1 Aug. 21, 2025

(51) Int. Cl.
| | |
|---|---|
| *G11C 16/28* | (2006.01) |
| *G11C 16/04* | (2006.01) |
| *G11C 16/24* | (2006.01) |
| *G11C 16/34* | (2006.01) |
| *G11C 29/02* | (2006.01) |

(52) U.S. Cl.
CPC .......... *G11C 16/28* (2013.01); *G11C 16/0483* (2013.01); *G11C 16/24* (2013.01); *G11C 16/3404* (2013.01); *G11C 29/028* (2013.01)

(58) Field of Classification Search
CPC ..... G11C 16/28; G11C 16/0483; G11C 16/24; G11C 29/028; G11C 16/3404; G11C 16/3431
See application file for complete search history.

(56) References Cited

U.S. PATENT DOCUMENTS

| | | | |
|---|---|---|---|
| 7,382,638 B2 | 6/2008 | Ma | |
| 8,913,412 B1 | 12/2014 | Khanna | |
| 10,089,359 B2 | 10/2018 | De Santis | |
| 11,232,038 B2 * | 1/2022 | Vasyltsov | .............. G06N 3/048 |
| 2012/0188811 A1 * | 7/2012 | Mattausch | ............. G11C 15/04 |
| | | | 365/49.17 |

(Continued)

FOREIGN PATENT DOCUMENTS

| | | |
|---|---|---|
| TW | I758188 B | 3/2022 |

OTHER PUBLICATIONS

U.S. Appl. No. 18/195,540, filed May 10, 2023.

*Primary Examiner* — Amir Zarabian
*Assistant Examiner* — Justin Bryce Heisterkamp
(74) *Attorney, Agent, or Firm* — McClure, Qualey & Rodack, LLP

(57) ABSTRACT

A memory searching engine is provided in present disclosure. The memory searching engine stores at least one reference time and at least one reference voltage corresponding to multiple Hamming distances and comprises a data array and a reference array. The data array stores at least one first pattern data and is configured to perform a data searching according to the difference between at least one input data and the first pattern data. The reference array stores at least one second pattern data and receives the input data. Each of the first and second pattern data comprises m features, wherein m is an integer. The memory searching engine calculates multiple updated reference times and updated reference voltages corresponding to the Hamming distances based on the second pattern data, and update the reference time according to the updated reference times, or update the reference voltage according to the updated reference voltages.

17 Claims, 6 Drawing Sheets

600

(56) References Cited

U.S. PATENT DOCUMENTS

| | | | |
|---|---|---|---|
| 2023/0098775 A1* | 3/2023 | Fu ......................... | G11C 29/18 |
| | | | 365/185.09 |
| 2023/0166035 A1* | 6/2023 | Rosinko ................. | G16H 20/17 |
| | | | 600/365 |
| 2024/0036746 A1 | 2/2024 | You | |
| 2024/0274199 A1* | 8/2024 | Lin ....................... | G11C 16/26 |
| 2024/0386958 A1* | 11/2024 | Tseng .................... | G11C 7/067 |
| 2025/0014635 A1* | 1/2025 | Tseng .................... | G11C 16/26 |
| 2025/0087268 A1* | 3/2025 | Tseng ................. | G11C 11/5642 |
| 2025/0118377 A1* | 4/2025 | Tseng .................... | G11C 16/28 |
| 2025/0253001 A1* | 8/2025 | Lin ....................... | G11C 16/26 |

* cited by examiner

100

| C3 | C4 | SA |
|----|----|----|
| C1 | C2 | SA |

MEMORY SEARCHING ENGINE, REFERENCE ARRAY AND REFERENCE CALIBRATING METHOD

BACKGROUND

Technical Field

The present disclosure is related to a memory searching engine, a reference array and a reference calibrating method. More particularly, the present disclosure is related to a memory searching engine, a reference array and a reference calibrating method having a function for calibrating the reference voltage and the reference time used for data searching.

Description of Related Art

With the development of flash memory technology, three-dimensional (3D) flash memory has gradually replaced traditional planar flash memory due to its lower unit cost. In addition, since big data and artificial intelligence technology require a large amount of calculations, data searching and data comparing functions have become important functions in 3D flash memory.

However, after long-term storage or internal temperature changes, the electronic properties of the 3D flash memory may shift, which results in changes in the scanned current and further affects the data searching function of the 3D flash memory. Consequently, how to effectively calibrate the search-related parameters as the shift of the electronic properties in 3D flash memory is one of the topics in this field.

SUMMARY

A memory searching engine is provided in present disclosure. The memory searching engine stores at least one reference time and at least one reference voltage corresponding to a plurality of Hamming distances. The memory searching engine comprises a data array and a reference array. The data array stores at least one first pattern data and is configured to perform a data searching according to the difference between at least one input data and the at least one first pattern data, so as to generate a searching result. Each of the first pattern data comprises m features, wherein m is an integer. The reference array stores at least one second pattern data and is configured to receive the at least one input data. Each of the second pattern data comprises m features. The memory searching engine is further configured to calculate a plurality of updated reference times and a plurality of updated reference voltages corresponding to the plurality of Hamming distances based on the at least one second pattern data and perform a reference calibrating, so as to update the at least one reference time according to the plurality of updated reference times, or update the at least one reference voltage according to the plurality of updated reference voltages.

In some embodiments of the memory searching engine, the reference array comprises a plurality of bit lines and a plurality of Not-AND (NAND) strings, the plurality of NAND strings are each coupled between one of the plurality of bit lines and a common source line. The plurality of NAND strings are configured to store the at least one second pattern data, and ones of the plurality of NAND strings coupled to the same bit line respectively store a plurality of portions of the at least one second pattern data, and the plurality of portions are same to each other.

In some embodiments of the memory searching engine, the at least one input data comprises an input data, the at least one second pattern data comprises a plurality of second pattern data in different types. A plurality of combinations of the input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the memory searching engine, the at least one input data comprises a plurality of input data in different types, the at least one second pattern data comprises a second pattern data. A plurality of combinations of the plurality of input data and the second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the memory searching engine, the at least one input data comprises a plurality of input data in different types, the at least one second pattern data comprises a plurality of second pattern data in different types. A plurality of combinations of the plurality of input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the memory searching engine, the reference calibrating is performed before the data searching is performed, or the reference calibrating is performed every other a calibration cycle.

In some embodiments of the memory searching engine, the area of the reference array arranged in the memory searching engine is less than or equal to the area of the data array arranged in the memory search engine.

A reference array arranged in a memory searching engine is provided in the present disclosure. The memory searching engine stores at least one reference time and at least one reference voltage corresponding to a plurality of Hamming distances, and the memory searching engine comprises a data array storing at least one first pattern data. Each of the first pattern data comprises m features, wherein m is an integer. The reference array is configured to store at least one second pattern data and configured to receive at least one input data, wherein each of the second pattern data comprises m features. The at least one second pattern data is configured to be provided to the memory searching engine, so as to calculate a plurality of updated reference times and a plurality of updated reference voltages corresponding to the plurality of Hamming distances, and allow the memory searching engine to perform a reference calibrating, so as to update the at least one reference time according to the plurality of updated reference times, or update the at least one reference voltage according to the plurality of updated reference voltages.

In some embodiments of the reference array, the reference array comprises a plurality of bit lines and a plurality of Not-AND (NAND) strings, the plurality of NAND strings are each coupled between one of the plurality of bit lines and a common source line. The plurality of NAND strings are configured to store the at least one second pattern data, and ones of the plurality of NAND strings coupled to the same bit line respectively store a plurality of portions of the at least one second pattern data, and the plurality of portions are same to each other.

In some embodiments of the reference array, the at least one input data comprises an input data, the at least one second pattern data comprises a plurality of second pattern data in different types. A plurality of combinations of the input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the reference array, the at least one input data comprises a plurality of input data in different types, the at least one second pattern data comprises a second pattern data. A plurality of combinations of the plurality of input data and the second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the reference array, the at least one input data comprises a plurality of input data in different types, the at least one second pattern data comprises a plurality of second pattern data in different types. A plurality of combinations of the plurality of input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the reference array, the reference calibrating is performed before a data searching is performed by the memory searching engine, or the reference calibrating is performed every other a calibration cycle.

In some embodiments of the reference array, the area of the reference array arranged in the memory searching engine is less than or equal to the area of the data array arranged in the memory search engine.

A reference calibrating method suitable for a memory search engine is provided in the present disclosure. The memory search engine comprises a data array and a reference array, and stores at least one reference time and at least one reference voltage corresponding to a plurality of Hamming distances. The data array stores at least one first pattern data, the reference array stores at least one second pattern data. Each of the first pattern data comprises m features, and each of the second pattern data comprises m features, wherein m is an integer. The reference calibrating method comprises: receiving, by the reference array, at least one input data; calculating, by the memory search engine, a plurality of updated reference times and a plurality of updated reference voltages corresponding to the plurality of Hamming distances, based on the at least one second pattern data; and updating, by the memory search engine, the at least one reference time according to the plurality of updated reference times, or the at least one reference voltage according to the plurality of updated reference voltages.

In some embodiments of the reference calibrating method, the reference array comprises a plurality of bit lines and a plurality of Not-AND (NAND) strings, the plurality of NAND strings are each coupled between one of the plurality of bit lines and a common source line. The plurality of NAND strings are configured to store the at least one second pattern data, and ones of the plurality of NAND strings coupled to the same bit line respectively store a plurality of portions of the at least one second pattern data, and the plurality of portions are same to each other.

In some embodiments of the reference calibrating method, the at least one input data comprises an input data, the at least one second pattern data comprises a plurality of second pattern data in different types. A plurality of combinations of the input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the reference calibrating method, the at least one input data comprises a plurality of input data in different types, the at least one second pattern data comprises a second pattern data. A plurality of combinations of the plurality of input data and the second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the reference calibrating method, the at least one input data comprises a plurality of input data in different types, the at least one second pattern data comprises a plurality of second pattern data in different types. A plurality of combinations of the plurality of input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

In some embodiments of the reference calibrating method, the reference calibrating method is performed before a data searching is performed by the memory searching engine, or the reference calibrating method is performed every other a calibration cycle.

With the memory searching engine, the reference array and the reference calibrating method disclosed in the present disclosure, the reference time and the reference voltage used in data searching can be updated periodically, so as to prevent the changes in the electronic properties of the memory searching engine from affecting the results of data searching.

It should be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

FIG. 1 is a simplified top view of a memory searching engine in accordance with some embodiments of the present disclosure.

DETAILED DESCRIPTION

Figure 2:
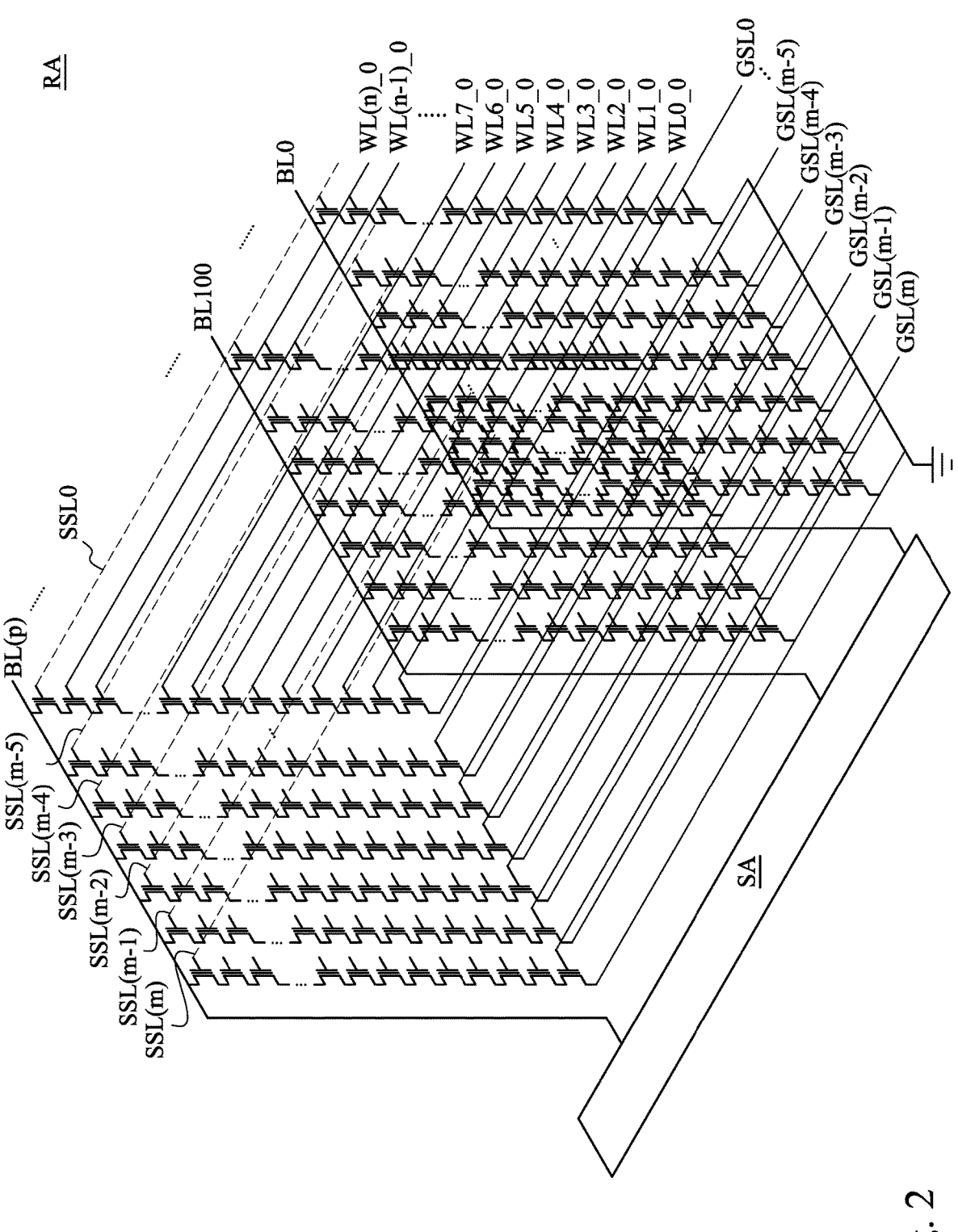
FIG. 2 is a partial perspective view of a reference array in accordance with some embodiments of the present disclosure.

Reference will now be made in detail to the present embodiments of the disclosure, examples of which are illustrated in the accompanying drawings.

In the present disclosure, when an element is referred to as "connected", it may mean "electrically connected" or "optical connected". When an element is referred to as "coupled", it may mean "electrically coupled" or "optical coupled". "Connected" or "coupled" can also be used to indicate that two or more components operate or interact with each other. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

FIG. 1 is a simplified top view of memory searching engine 100 in accordance with some embodiments of the present disclosure. In some embodiments, the memory searching engine 100 comprises a plurality of half-planes (e.g., the half-planes C1-C4 in FIG. 1) and a plurality of sensing amplifiers SA, wherein each of the plurality of sensing amplifiers SA is adjacent to at least one half-plane (e.g., the two sensing amplifiers SA in FIG. 1 are respectively adjacent to the half-plane C2 and C4), and is configured to connect to a data array or a reference array (described in the following paragraphs) in the corresponding half-plane. In some embodiments, a combination of two half-planes (e.g., the half-planes C1 and C2) is referred to as a plane.

In some embodiments, the half-planes C1-C4 are configured to set a data array or a reference array, the area of the reference array arranged in the memory searching engine 100 is less than or equal to the area of the data array arranged in the memory search engine 100. For example, as shown in FIG. 1, in the half-planes C1-C4, the area marked with dots is the area for setting the reference array, and the area without dots is the area for setting the data array, thus the area of the half-plane C1 where the reference array is set is less than the area of the half-planes C2-C4 where the data array is set.

It should be noted that the arrangement of the data array and reference array in FIG. 1 in present disclosure is only an example, and is not intended to limit the present disclosure. In the case that the area of the reference array arranged in the memory searching engine 100 is less than or equal to the area of the data array arranged in the memory search engine 100, other arrangements of the data array and reference array are within the scope of the present disclosure. In some embodiments, the reference array is arranged in the half-planes C1 and C2, and the data array is arranged in the half-planes C3 and C4. In some embodiments, the reference array is arranged in half the area of the half-planes C1, and the data array is arranged in the half-planes C2-C4 and another half the area of the half-planes C1.

FIG. 2 is a partial perspective view of a reference array RA in accordance with some embodiments of the present disclosure. In some embodiments, the reference array RA comprises bit lines BL0-BL(p) arranged in parallel and a plurality of Not-AND (NAND) strings (not labeled for the sake of brevity in FIG. 2, which will be described in subsequent paragraphs and figures), and the reference array RA is configured to receive at least one input data, wherein p is an integer. The bit lines BL0-BL(p) connect to the sensing amplifiers SA. Each of the NAND strings is connected between one of the bit lines BL0-BL(p) and a common source line CSL, and the number of the NAND strings that each of the bit lines BL0-BL(p) connects to is same to each other. With regard to the structure formed by the bit lines BL0-BL(p) and the NAND strings, please refer to FIG. 2 and FIG. 3 together.

Figure 3:
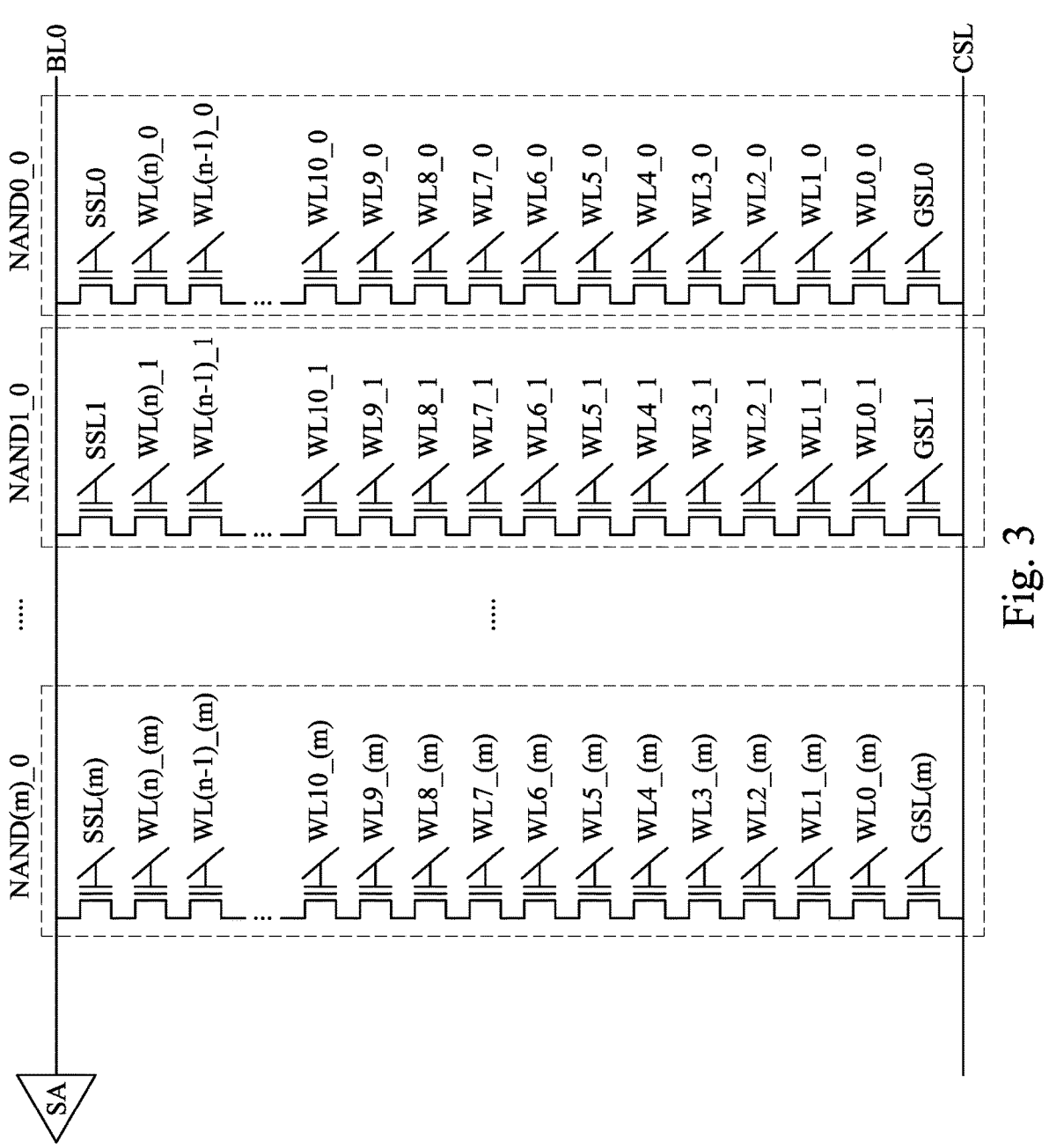
FIG. 3 is a schematic diagram of a bit line and Not-AND (NAND) strings in accordance with some embodiments of the present disclosure.

FIG. 3 is a schematic diagram of the bit line BL0 and the NAND strings NAND0_0-NAND(m)_0 connected to the bit line BL0 in accordance with some embodiments of the present disclosure. As shown in FIG. 3, in some embodiments, the NAND strings NAND0_0-NAND(m)_0 are coupled between the bit line BL0 and the common source line CSL, wherein m is an integer. The NAND strings NAND0_0-NAND(m)_0 each comprises a plurality of serially coupled transistors with the same number, and the control terminals of these transistors are correspondingly coupled to string select lines SSL0-SSL(m), ground select lines GSL0-GSL(m) or word lines WL0_0-WL(n)_(m), wherein n is an integer. Take the instance in FIG. 3 for example, in the NAND string NAND0_0, the control terminal of the transistor closest to the common source line CSL is coupled to the ground select line GSL0, the control terminal of the transistor closest to the bit line BL0 is coupled to the string select line SSL0, and the control terminals of the other transistors are respectively coupled to the word lines WL0_0-WL(n)_0; in the NAND string NAND0_1, the control terminal of the transistor closest to the common source line CSL is coupled to the ground select line GSL1, the control terminal of the transistor closest to the bit line BL0 is coupled to the string select line SSL1, and the control terminals of the other transistors are respectively coupled to the word lines WL0_1-WL(n)_1, and so on.

The arrangement of each of the bit lines BL0-BL(p) and corresponding NAND strings is similar to the arrangement of the bit lines BL0 and the NAND strings NAND0_0-NAND(m)_0. For example, the bit line BL1 also connects to m NAND strings, and the connection relationships between these m NAND strings and the common source line CSL, the string select lines SSL0-SSL(m), the ground select lines GSL0-GSL(m), the word lines WL0_0-WL(n)_(m) are similar to aforementioned content about the NAND strings NAND0_0-NAND(m)_0. For the sake of brevity, similar content will not be repeated here.

Through the connection relationships between the plurality of bit lines, the plurality of NAND strings, the plurality of word lines, the plurality of string select lines and the plurality of ground select lines mentioned above, the reference array RA forms a three-dimensional (3D) structure as shown in FIG. 2. In addition, the structure of the data array (not shown) in the memory searching engine 100 is similar to the reference array RA. For the sake of brevity, the details will not be repeated here.

In some embodiments, in each of the NAND strings, two adjacent transistors coupled to the word lines correspond to one bit of In-Memory-Search (IMS). Take the instance in FIG. 3 for example, in the NAND string NAND0_0, the transistors coupled to the word lines WL0_0 and WL1_0 correspond to the first bit of IMS, the transistors coupled to the word lines WL2_0 and WL3_0 correspond to the second bit of IMS, and so on.

In some embodiments, according to the configuration and conduction status of the plurality of transistors in the NAND string, a pattern data is stored in each NAND string, and all NAND strings connected to the same bit line store the same pattern data. Take the instance in FIG. 3 for example, the NAND strings NAND0_0-NAND(m)_0 connected to the bit line BL0 store the same pattern data.

In some embodiments, each of the data array (not shown) and the reference array RA in the memory searching engine 100 stores the pattern data, wherein the pattern data stored by the data array and the pattern data stored by the reference array RA have the same number of features. In addition, in some embodiments, the memory searching engine 100 is configured to perform a data searching based on the received input data and the pattern data stored in the data array, and then outputs a corresponding searching result.

Figure 4B:
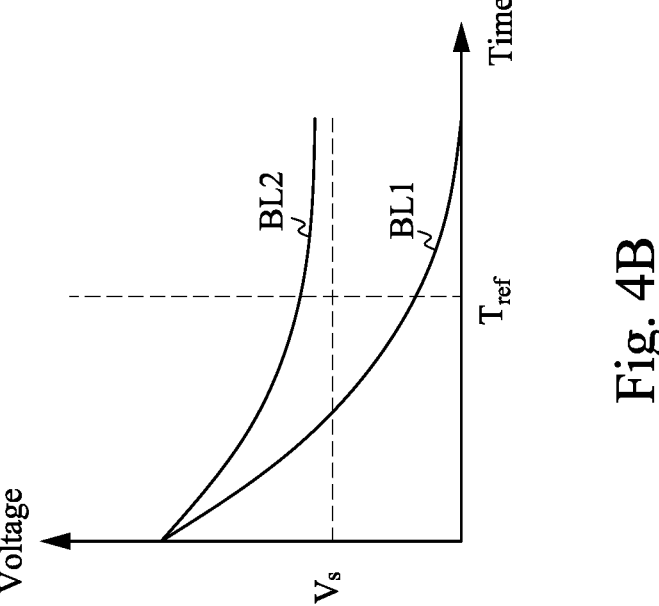
FIG. 4B is a graph of discharge curves of different bit lines in accordance with some embodiments of the present disclosure.
Figure 4A:
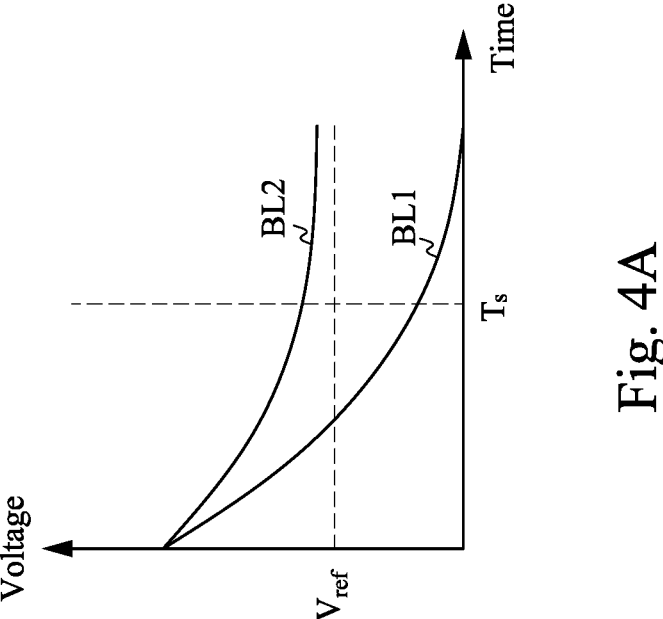
FIG. 4A is a graph of discharge curves of different bit lines in accordance with some embodiments of the present disclosure.

Since the pattern data of the data array and the reference array RA may have different patterns, the logic value output by the bit line depends on the relationship between its discharge curve and the reference time or reference voltage. Please refer to FIG. 4A and FIG. 4B. FIG. 4A and FIG. 4B are graphs of discharge curves of the bit lines BL1 and BL2 in accordance with some embodiments of the present disclosure. The discharge curves in FIG. 4A are similar to the discharge curves in FIG. 4B. The difference is that in the embodiment of FIG. 4A, the outputs of the bit lines BL1 and BL2 are determined according to a reference voltage Vref, while in the embodiment of FIG. 4B, the outputs of the bit lines BL1 and BL2 are determined according to a reference time Tref.

First, please refer to FIG. 4A. In the embodiments of FIG. 4A, the reference voltage Vref is the reference voltage (e.g., set by a logic unit in the memory searching engine 100) used to determine the logic values of the bit lines BL1 and BL2. At sensing time Ts, the voltage of the bit line BL1 has decreased to the voltage lower than the reference voltage Vref, thus the bit line BL1 will generate an output corresponding to logic "1". On the other hand, at sensing time Ts, although the voltage of the bit line BL2 has decreased, it still remains higher than the reference voltage Vref, thus the bit line BL2 will generate an output corresponding to logic "0".

Next, please refer to FIG. 4B. In the embodiments of FIG. 4B, the reference time Tref is the reference time (e.g., set by a logic unit in the memory searching engine 100) used to determine the logic values of the bit lines BL1 and BL2. Since the time required for the voltage of the bit line BL1 to drop from the start of discharge to the sensing voltage Vs is less than the reference time Tref, the bit line BL1 will generate an output corresponding to logic "1". On the other hand, since the time required for the voltage of the bit line BL1 to drop from the start of discharge to the sensing voltage Vs is more than the reference time Tref, the bit line BL2 will generate an output corresponding to logic "0".

It should be noted that the discharge curves and the output configurations of logic values in FIG. 4A and FIG. 4B in present disclosure is only an example, and is not intended to limit the present disclosure. Other discharge curves and output configurations of logic values are within the scope of the present disclosure.

As mentioned above, in some embodiments, the memory searching engine 100 stores at least one reference time Tref and at least one reference voltage Vref, and these reference times Tref and reference voltage Vref correspond to a plurality of Hamming distances (HD).

Specifically, Hamming distance represents the amount of bit difference between input data and stored data. For example, the stored data is a binary string "000000", when the input data is a binary string "000001", since there is one bit difference between the input data and the stored data, the Hamming distance is 1; when the input data is a binary string "011011", since there are four bit differences between the input data and the stored data, the Hamming distance is 4, and so on. Depending on the difference between the input data and the stored data (i.e., the Hamming distance), the bit lines will have different discharge curves. Therefore, in order to determine the logic values for discharge curves with different Hamming distances, the memory searching engine 100 stores at least one reference time Tref and at least one reference voltage Vref corresponding to the plurality of Hamming distances.

However, long-term data storage or temperature changes of the memory may cause the electronic properties of the memory searching engine 100 to shift, thereby changing the discharge curves of the bit lines and affecting the outputs of the bit lines. Therefore, the reference time or reference voltage in the memory searching engine 100 may need to be updated. For example, the discharge curve of the bit line BL1 in FIG. 4A may be shifted to the position of the discharge curve of the bit line BL2, resulting in outputting different logic values. Therefore, in some embodiments, the memory searching engine 100 may perform a reference calibrating periodically or before performing specific operations (e.g., data searching) to adjust the stored reference time Tref and reference voltage Vref.

Figure 5B:
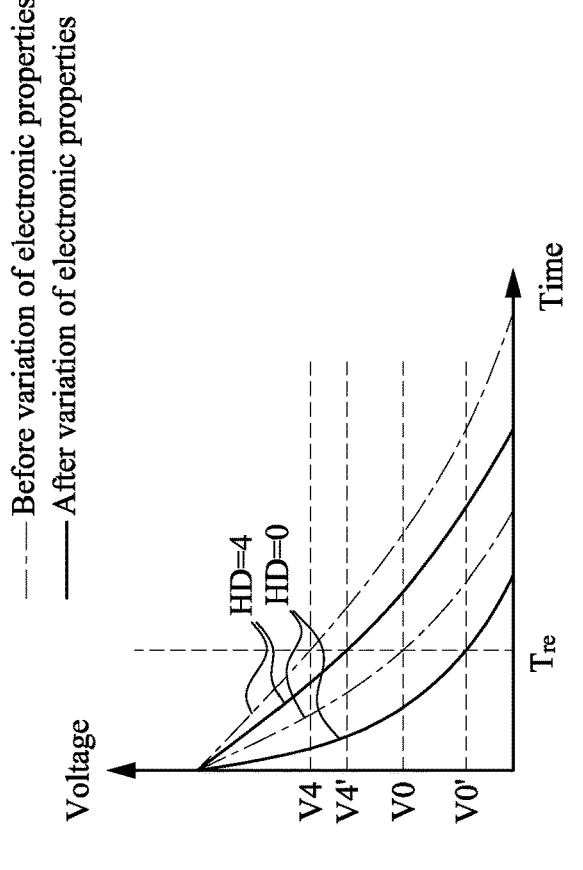
FIG. 5B is a schematic diagram of calibrating the reference voltage corresponding to changes in the discharge curve in accordance with some embodiments of the present disclosure.
Figure 5A:
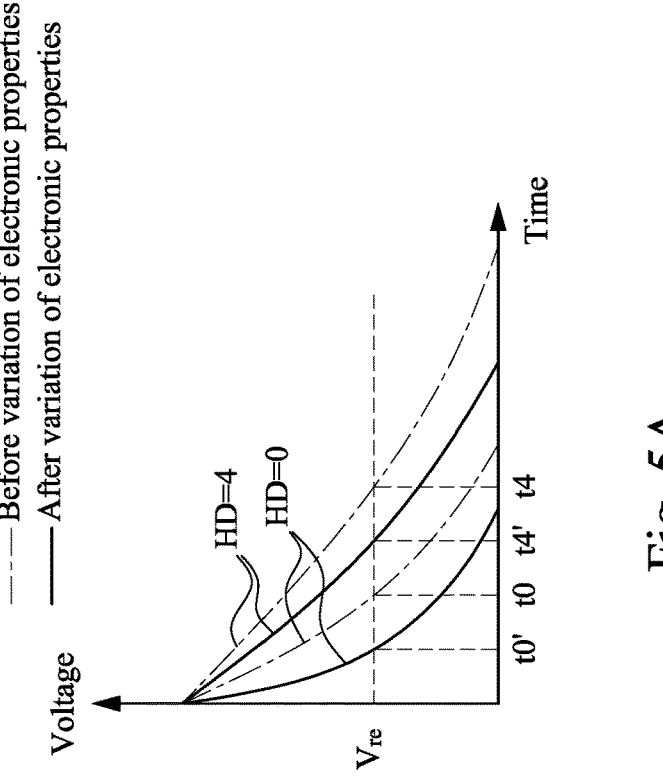
FIG. 5A is a schematic diagram of calibrating the reference time corresponding to changes in the discharge curve in accordance with some embodiments of the present disclosure.

FIG. 5A is a schematic diagram of calibrating the reference time corresponding to changes in the discharge curve in accordance with some embodiments of the present disclosure. FIG. 5B is a schematic diagram of calibrating the reference voltage corresponding to changes in the discharge curve in accordance with some embodiments of the present disclosure. The discharge curves corresponding to Hamming distance of 0 and Hamming distance of 4 in FIG. 5A and are similar to the discharge curves corresponding to Hamming distance of 0 and Hamming distance of 4 in FIG. 5B. The difference is that FIG. 5A illustrates the time it takes for a bit line to discharge to a specific voltage, and FIG. 5B illustrates the voltage the bit line reaches after a specific time.

First, please refer to FIG. 5A. In the embodiments of FIG. 5A, the memory searching engine 100 first determines a calibration voltage Vre, and calculates the times respectively required for the bit lines with Hamming distances of 0 (HD=0) and 4 (HD=4) to discharge to the calibration voltage Vre. As shown in FIG. 5A, before the electronic properties of the memory searching engine 100 change, the bit lines with Hamming distances of 0 and 4 are discharged to the calibration voltage Vre at time t0 and time t4 respectively. After the electronic properties of the memory searching engine 100 change, the bit lines with Hamming distances of 0 and 4 are discharged to the calibration voltage Vre at time t0' and time t4' respectively. Therefore, the memory searching engine 100 determines the time t0' and time t4' to be updated reference times to respectively replace the original reference times Tref corresponding to the bit lines with Hamming distances of 0 and 4 (i.e., time t0 and time t4) to complete a reference calibration operation.

Next, please refer to FIG. 5B. In the embodiments of FIG. 5B, the memory searching engine 100 first determines a calibration time Tre, and calculates the voltage respectively the bit lines with Hamming distances of 0 (HD=0) and 4 (HD=4) reach at the calibration times Tre. As shown in FIG. 5B, the bit lines with Hamming distances of 0 and 4 are discharged to voltage V0 and voltage V4 respectively at the calibration time Tre. After the electronic properties of the memory searching engine 100 change, the bit lines with Hamming distances of 0 and 4 are discharged to voltage V0' and voltage V4' respectively at the calibration time Tre. Therefore, the memory searching engine 100 determines the voltage V0' and voltage V4' to be updated reference voltages to respectively replace the original reference voltages Vref corresponding to the bit lines with Hamming distances of 0 and 4 (i.e., voltage V0 and voltage V4) to complete a reference calibration operation.

In some embodiments, in order to enhance the accuracy of updating the reference time Tref and the reference voltage Vref, in the data array and the reference array RA, the same pattern data will be stored in a plurality of bit lines (for example, 10-100 bit lines). Therefore, the memory searching engine 100 can perform the reference calibration according to the updated reference times and updated reference voltages of the plurality of different bit lines corresponding to the same Hamming distance.

Continuing from the instances in FIG. 5A and FIG. 5B, the bit lines BL0-BL99 in the reference array RA are configured to store the pattern data corresponding to the Hamming distance of 0, and the bit lines BL100-BL199 are configured to store the pattern data corresponding to the Hamming distance of 4. The memory searching engine 100 can obtain each 100 data of voltage V0', voltage V4', time t0' and time t4' according to the discharge curves of each of the bit lines BL0-BL99, BL100-BL199, and updated the reference voltage Vref and the reference time Tref corresponding to the bit lines with Hamming distances of 0 and 4 based on these each 100 data of voltage V0', voltage V4', time t0' and time t4'.

In some embodiments, the memory searching engine 100 can calibrate the reference voltage Vref and the reference time Tref based on the average, median, normal distribution or other statistical values of the plurality of updated reference voltages and the plurality of updated reference times respectively.

The Hamming distances between the input data and the pattern data stored in the data array and reference array RA can have a plurality of different configurations. In some embodiments, the input data input into the reference array RA comprises input data in only one type (e.g., a binary string "0000"), and the pattern data stored by the data array and the reference array RA comprises a plurality of pattern data in different types (e.g., binary strings "0000", "0001", "0010", . . . , "1111"). In this configuration, the memory searching engine 100 can calculate the plurality of updated reference times and the plurality of updated reference voltages corresponding to different Hamming distances based on the input data in one type and the plurality pattern data in different types.

In some embodiments, the input data input into the reference array RA comprises a plurality of input data in different types (e.g., binary strings "0000", "0001", "0010", . . . , "1111"), and the pattern data stored by the data array and the reference array RA comprises pattern data in only one type (e.g., a binary string "0000"). In this configuration, the memory searching engine 100 can calculate the plurality of updated reference times and the plurality of updated reference voltages corresponding to different Hamming distances based on the plurality of input data in different types and the pattern data in one type. Since the data array and the reference array RA can only store one type of pattern data, storage space can be saved.

In some embodiments, the configuration of the input data and the pattern data can be determined by combining the two configurations described above. That is, the input data input into the reference array RA comprises a plurality of input data in different types (e.g., binary strings "0000", "0001", "0010", . . . "1111"), and the pattern data stored by the data array and the reference array RA also comprises a plurality of pattern data in different types (e.g., binary strings "0000", "0001", "0010", . . . , "1111"). In this configuration, the memory searching engine 100 can calculate the plurality of updated reference times and the plurality of updated reference voltages corresponding to different Hamming distances based on the plurality of input data in different types and the plurality pattern data in different types. This configuration can reduce the amount and complexity of input data, and also avoid using excessive storage space in the data array and the reference array RA.

In some embodiments, the reference calibration on the reference voltage Vref and the reference time Tref performed by the memory searching engine 100 can be performed during a calibration cycle that occurs once before each data searching is performed, or be performed before every other data searching is performed, so as to ensure that the reference voltage Vref and the reference time Tref are updated periodically.

Figure 6:
FIG. 6 is a flowchart of a reference calibrating method in accordance with some embodiments of the present disclosure.
Figure 6:
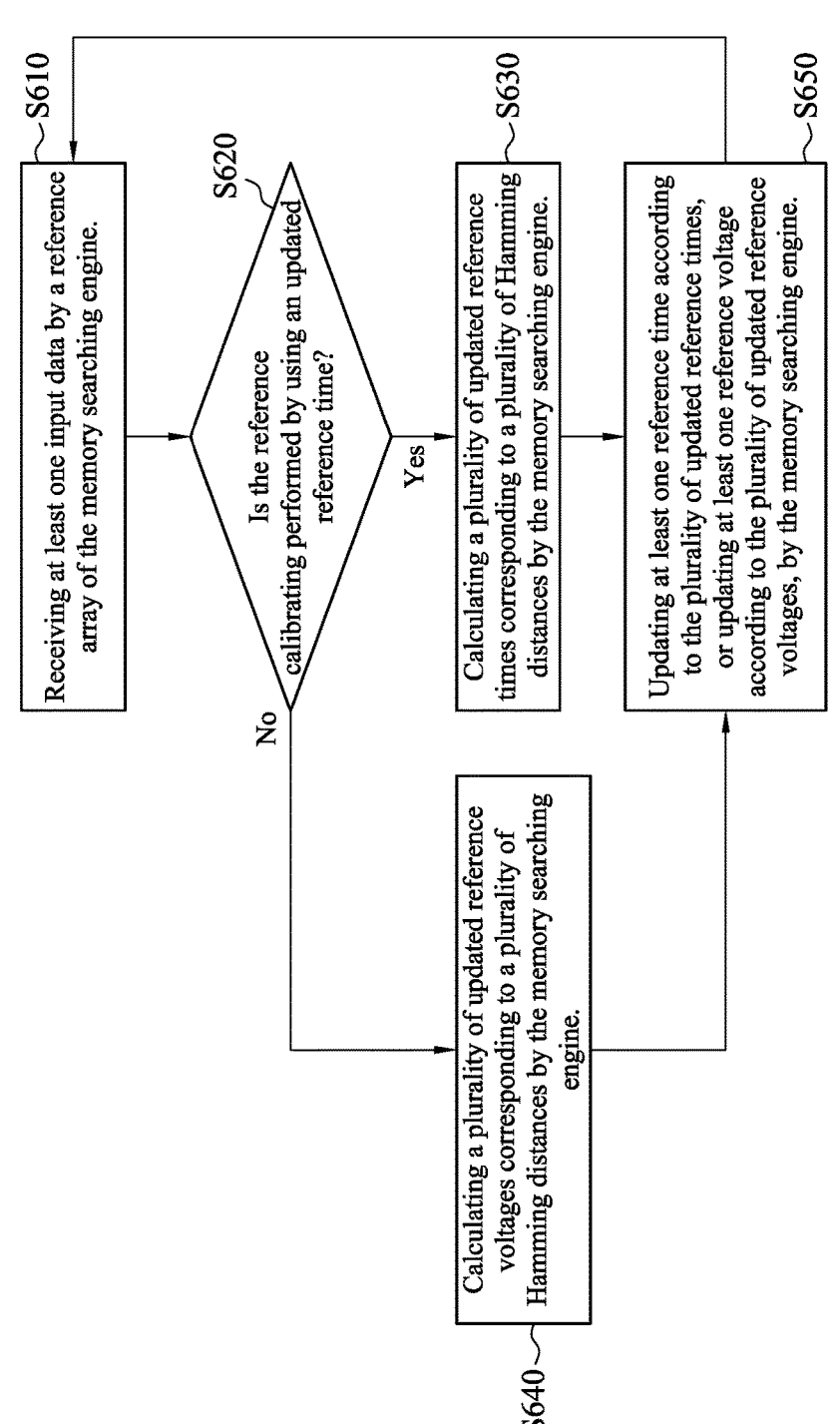

FIG. 6 is a flowchart of a reference calibrating method 600 in accordance with some embodiments of the present disclosure. In some embodiments, the reference calibrating method 600 comprises steps S610, S620, S630, S640 and S650.

In step S610, the reference array RA of the memory searching engine 100 receives at least one input data. Next, step S620 will be performed.

In step S620, the memory searching engine 100 determines whether to calibrate the original reference time based on the updated reference time or to calibrate the original reference voltage based on the updated reference voltage. If the memory searching engine 100 determines to calibrate the original reference time based on the updated reference time, step S630 will be performed; if the memory searching engine 100 determines to calibrate the original reference voltage based on the updated reference voltage, step S640 will be performed.

In step S630, the memory searching engine 100 calculates a plurality of updated reference times corresponding to a plurality of Hamming distances based on the pattern data stored in the reference array RA. Next, step S650 will be performed.

In step S640, the memory searching engine 100 calculates a plurality of updated reference voltages corresponding to a plurality of Hamming distances based on the pattern data stored in the reference array RA. Next, step S650 will be performed.

In step S650, the memory searching engine 100 updates the stored original reference times corresponding to the plurality of Hamming distances according to the plurality of updated reference times, or updates the stored original reference voltages corresponding to the plurality of Hamming distances according to the plurality of updated reference voltages.

It should be noted that the number and order of steps in the reference calibrating method 600 in present disclosure are only examples, and are not intended to limit the present disclosure. The other number and order of steps in the reference calibrating method 600 are within the scope of the present disclosure. In some embodiments, step S620 can be omitted, steps S630 and S640 can be perform sequentially, and then step S650 is performed.

Through the memory searching engine, reference array and reference calibrating method in present disclosure, the reference time and reference voltage corresponding to different Hamming distances can be updated regularly to respond to shifts in electronic properties and changes in discharge curves of bit lines due to long-term data storage or temperature changes inside the memory, so as to maintain the normal operation of the data searching function.

The above are preferred embodiments of the present disclosure. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A memory searching engine, storing at least one reference time and at least one reference voltage corresponding to a plurality of Hamming distances, wherein the memory searching engine comprises:

a data array, storing at least one first pattern data and configured to perform a data searching according to the difference between at least one input data and the at least one first pattern data, so as to generate a searching result; and a reference array, storing at least one second pattern data and configured to receive the at least one input data, wherein the memory searching engine is further configured to calculate a plurality of updated reference times and a plurality of updated reference voltages corresponding to the plurality of Hamming distances based on the at least one second pattern data and perform a reference calibrating, so as to update the at least one reference time according to the plurality of updated reference times, or update the at least one reference voltage according to the plurality of updated reference voltages.

2. The memory searching engine of claim 1, wherein the reference array comprises a plurality of bit lines and a plurality of Not-AND (NAND) strings, the plurality of NAND strings are each coupled between one of the plurality of bit lines and a common source line, and wherein the plurality of NAND strings are configured to store the at least one second pattern data, and ones of the plurality of NAND strings coupled to the same bit line respectively store a plurality of portions of the at least one second pattern data, and the plurality of portions are same to each other.

3. The memory searching engine of claim 1, wherein the at least one second pattern data comprises a plurality of second pattern data in different types, and wherein a plurality of combinations of the at least one input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

4. The memory searching engine of claim 1, wherein the at least one input data comprises a plurality of input data in different types, and wherein a plurality of combinations of the plurality of input data and the at least one second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

5. The memory searching engine of claim 1, wherein the at least one input data comprises a plurality of input data in different types, the at least one second pattern data comprises a plurality of second pattern data in different types, and wherein a plurality of combinations of the plurality of input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

6. The memory searching engine of claim 1, wherein each of the first pattern data comprises m features, each of the second pattern data comprises m features, wherein m is an integer.

7. A reference array, arranged in a memory searching engine, wherein the memory searching engine stores at least one reference time and at least one reference voltage corresponding to a plurality of Hamming distances, and the memory searching engine comprises a data array storing at least one first pattern data, wherein the reference array is configured to store at least one second pattern data and configured to receive at least one input data, and wherein the at least one second pattern data is configured to be provided to the memory searching engine, so as to calculate a plurality of updated reference times and a plurality of updated reference voltages corresponding to the plurality of Hamming distances, and allow the memory searching engine to perform a reference calibrating, so as to update the at least one reference time according to the plurality of updated reference times, or update the at least one reference voltage according to the plurality of updated reference voltages.

8. The reference array of claim 7, wherein the reference array comprises a plurality of bit lines and a plurality of Not-AND (NAND) strings, the plurality of NAND strings are each coupled between one of the plurality of bit lines and a common source line, and wherein the plurality of NAND strings are configured to store the at least one second pattern data, and ones of the plurality of NAND strings coupled to the same bit line respectively store a plurality of portions of the at least one second pattern data, and the plurality of portions are same to each other.

9. The reference array of claim 7, wherein the at least one second pattern data comprises a plurality of second pattern data in different types, and wherein a plurality of combinations of the at least one input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

10. The reference array of claim 7, wherein the at least one input data comprises a plurality of input data in different types, and wherein a plurality of combinations of the plurality of input data and the at least one second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

11. The reference array of claim 7, wherein the at least one input data comprises a plurality of input data in different types, the at least one second pattern data comprises a plurality of second pattern data in different types, and wherein a plurality of combinations of the plurality of input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

12. The reference array of claim 7, wherein each of the first pattern data comprises m features, each of the second pattern data comprises m features, wherein m is an integer.

13. A reference calibrating method, suitable for a memory search engine comprising a data array and a reference array, wherein the memory searching engine stores at least one reference time and at least one reference voltage corresponding to a plurality of Hamming distances, and the data array stores at least one first pattern data, the reference array stores at least one second pattern data, wherein the reference calibrating method comprises:

receiving, by the reference array, at least one input data;

calculating, by the memory search engine, a plurality of updated reference times and a plurality of updated reference voltages corresponding to the plurality of Hamming distances, based on the at least one second pattern data; and updating, by the memory search engine, the at least one reference time according to the plurality of updated reference times, or the at least one reference voltage according to the plurality of updated reference voltages.

14. The reference calibrating method of claim 13, wherein the reference array comprises a plurality of bit lines and a plurality of Not-AND (NAND) strings, the plurality of NAND strings are each coupled between one of the plurality of bit lines and a common source line, and wherein the plurality of NAND strings are configured to store the at least one second pattern data, and ones of the plurality of NAND strings coupled to the same bit line respectively store a plurality of portions of the at least one second pattern data, and the plurality of portions are same to each other.

15. The reference calibrating method of claim 13, wherein the at least one second pattern data comprises a plurality of second pattern data in different types, and wherein a plurality of combinations of the at least one input data and the plurality of second pattern data correspond to the plurality of Hamming distances, and one of the at least one reference time corresponding to each of the plurality of Hamming distances is configured to be updated according to at least one of the plurality of updated reference times, and one of the at least one reference voltage corresponding to each of the plurality of Hamming distances is configured to be updated according to at least one of the plurality of updated reference voltages.

16. The reference calibrating method of claim 13, wherein the at least one input data comprises a plurality of input data in different types, and wherein a plurality of combinations of the plurality of input data and the at least one second pattern data correspond to the plurality of Hamming distances, and one of the at least one reference time corresponding to each of the plurality of Hamming distances is config-
ured to be updated according to at least one of the
plurality of updated reference times, and one of the at
least one reference voltage corresponding to each of the
plurality of Hamming distances is configured to be
updated according to at least one of the plurality of
updated reference voltages.

17. The reference calibrating method of claim 13, wherein
the at least one input data comprises a plurality of input data
in different types, the at least one second pattern data
comprises a plurality of second pattern data in different
types, and wherein a plurality of combinations of the plurality of
input data and the plurality of second pattern data
correspond to the plurality of Hamming distances, and
one of the at least one reference time corresponding to
each of the plurality of Hamming distances is config-
ured to be updated according to at least one of the
plurality of updated reference times, and one of the at
least one reference voltage corresponding to each of the
plurality of Hamming distances is configured to be
updated according to at least one of the plurality of
updated reference voltages.

<div align="center">*   *   *   *   *</div>